US006351155B1

(12) United States Patent
Pogrebnoy (10) Patent No.: US 6,351,155 B1
(45) Date of Patent: Feb. 26, 2002

(54) HIGH-SPEED SENSE AMPLIFIER CAPABLE OF CASCADE CONNECTION

(75) Inventor: Yuri L. Pogrebnoy, Moscow (RU)

(73) Assignee: Elbrus International Limited, George Town Grand Cayman (KY)

(*) Notice: Subject to any disclaimer, the term of this patent is extended or adjusted under 35 U.S.C. 154(b) by 0 days.

(21) Appl. No.: 09/506,406

(22) Filed: Feb. 17, 2000

Related U.S. Application Data (60) Provisional application No. 60/120,378, filed on Feb. 17, 1999.

(51) Int. Cl.[7] .................................................. H03F 7/00
(52) U.S. Cl. .......................................... 327/51; 527/55
(58) Field of Search .............................. 327/51, 52, 54, 327/55, 56, 57

(56) References Cited

U.S. PATENT DOCUMENTS

| | | | |
|---|---|---|---|
| 3,879,621 A | | 4/1975 | Cavaliere et al. .............. 327/57 |
| 5,079,745 A | | 1/1992 | Ito et al. ...................... 365/207 |
| 5,267,198 A | * | 11/1993 | Hatano et al. .......... 365/189.01 |
| 5,608,681 A | * | 3/1997 | Priebe et al. ................. 365/207 |
| 5,958,075 A | * | 9/1999 | Wendell ....................... 714/726 |
| 6,046,609 A | * | 4/2000 | Toyoshima et al. ........... 327/55 |

OTHER PUBLICATIONS

Masataka Matsui, et al., 200MHz Video Compression Macrocells Using Low–Swing Differential Logic, IEEE International Solid–State Circuits Conference, 1994, Session 4, Video and Communication Signal Processors, Paper WP 4.6, pp 76–77, 314.

Dinesh Somasekhar, et al., Differential Current Switch Logic: A Low Power DCVS Logic Family, IEEE Journal of Solid–State Circuits, vol. 31, No. 7, Jul. 1996, pp. 981–991.

Dinesh Somasekhar, et al., LVDCSL: A High Fan–In, High–Performance, Low–Voltage Differential Current Switch Logic Family, Dec. 1998, IEEE Transactions on Very Large Scale Integration (VLSI) Systems, vol. 6, No. 4, pp. 573–577.

Akilesh Parameswar, et al., A Swing Restored Pass–Transistor Logic–Based Multiply and Accumulate Circuit for Multimedia Applications, IEEE Journal of Solid–State Circuits, vol. 31, No. 6, Jun. 1996, pp. 804–809.

Keith Diefendorff, Microprocessor Report, The Insiders' Guide to Microprocessor Hardware, *The Russians Are Coming, Supercomputer Maker Elbrus Seeks to Join x86/IA–64 Melee*, Feb. 15, 1999, vol. 13, No. 2, pp. 1–7.

* cited by examiner

Primary Examiner—Tuan T. Lam
Assistant Examiner—Hiep Nguyen
(74) Attorney, Agent, or Firm—Townsend and Townsend and Crew LLP (57) ABSTRACT

A clocked CMOS sense amplifier for high speed latching of low voltage complementary signals. The present invention includes a sense amplifier having a controlled cross-coupled transistor structure, a control circuit, a current source, a recovery transistor and protective transistors. A CORE circuit is provided which may be used to form different logic structures. Two large n-channel transistors in a discharging chain are used in combination with the small capacitances of the cross-coupled nodes to provide maximum speed and high output.

9 Claims, 10 Drawing Sheets

HIGH-SPEED SENSE AMPLIFIER CAPABLE OF CASCADE CONNECTION

CROSS-REFERENCES TO RELATED APPLICATIONS

This invention claims priority from co-pending U.S. Provisional Application No. 60/120,378 filed Feb. 17, 1999, the disclosure of which is incorporated herein in its entirety for all purposes.

FIELD OF THE INVENTION

The present invention relates to sense amplifiers, and more particularly, to a clocked CMOS differential sense amplifier having high speed and high output.

BACKGROUND OF THE INVENTION

Clocked sense amplifiers present a wide range of different circuit implementations, but in most cases, a cross-coupled transistor structure serves as a basis for the sense amplifier. The differences between various implementations relates to methods of imbalancing the cross-coupled nodes before or during the clock pulse edge.

Figure 1:
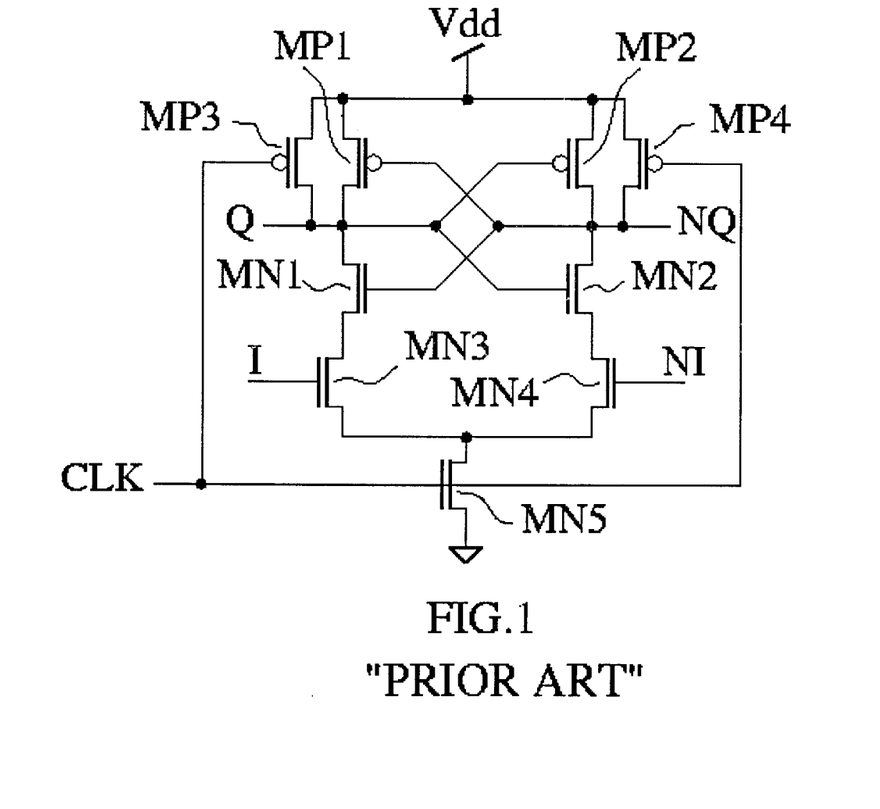
FIG. 1 shows a circuit diagram of a typical sense amplifier.

FIG. 1 shows a typical differential clocked sense amplifier. Transistors MP1, MP2, MN1, MN2 form a cross-coupled complementary structure. Transistor MN5 which is controlled by a strobe pulse, serves as a current source. Transistors MP3, MP4 are used for precharging cross-coupled output nodes Q and NQ to the supply voltage when the current source MN5 is off. Transistors MN3, MN4 provide different discharging currents in accordance with the imbalance in voltages at input nodes I and NI, when the current source MN5 turns on. The different discharging currents leads to different voltages at the output nodes Q and NQ. Because of the positive feedback, the output node with the lower potential will be pulled even lower, and the other output node will go back toward the supply voltage.

The speed and loading characteristics of any cross-coupled sense amplifier depend on the conductivity of the discharging chain and the capacitances of the cross-coupled nodes. The higher the conductivity and the lower the capacitance, the higher the speed and the output of an amplifier. Typical sense amplifiers have a discharging chain formed with three n-channel transistors, for example, MN1, MN3, MN5 in FIG. 1, which are connected in series. This leads to some limitation of conductivity. The capacitances of the cross-coupled nodes are composed of the drain capacitances of one p-channel and n-channel cross-coupled transistor pair, gate capacitances of the opposite pair and the drain capacitance of recovery transistor MP3. The P-channel transistors MP1, MP2 must be relatively large, because up to the rising edge of the clock pulse they both are off, and only when the lower cross-coupled node reaches Vdd—Vtp (where Vtp is the threshold voltage of p-channel transistor) one of them starts to conduct to provide the recovery of the opposite node to the supply voltage. The P-channel transistors MP3, MP4 must be large also to provide for the recovery of the discharged node to Vdd in a reasonable time. So, the capacitances of the cross-coupled nodes are significant, and concerning their discharging ability, include some parasitic components.

SUMMARY OF THE INVENTION

The present invention provides a clocked CMOS sense amplifier for high speed latching of low voltage complementary signals. The basic sense amplifier includes a controlled cross-coupled transistor structure, a control circuit, a current source, a recovery transistor and protective transistors. A CORE circuit is provided which may be used to form different logic structures. Two large n-channel transistors in a discharging chain are used in combination with the small capacitances of the cross-coupled nodes to provide maximum speed and high output.

In one embodiment of the present invention, a sense amplifier core is provided that includes a first PMOS pair that outputs complementary low voltage input signals, a cross-coupled NMOS pair with common source and drain for latching the complementary low voltage input signals and wherein a feedback signal is coupled between the NMOS pair and the first PMOS pair, a control circuit coupled to the first PMOS pair, and a second PMOS pair coupled to the first PMOS pair for preventing the complementary low voltage input signals from drifting.

Another aspect of the present invention relates to an accessory circuit for improving the recovering characteristics of the sense amplifier for use at high clock frequencies.

Another aspect of the present invention relates to an accessory circuit for output buffering of the sense amplifier for large load applications.

Another aspect of the present invention relates to an accessory circuit for input level conversion of the sense amplifier for use with half-supply voltage pre-charge of the input lines.

Another aspect of the present invention relates to a cascade connection of the sense amplifier cores in combination with n-channel current sources for performing logic functions.

Another aspect of the present invention relates to a complementary circuit of the sense amplifier wherein n-channel transistors are substituted with p-channel transistors (or vice versa) and the input lines are pre-charged to ground potential.

DESCRIPTION OF THE SPECIFIC EMBODIMENTS

Figure 2:
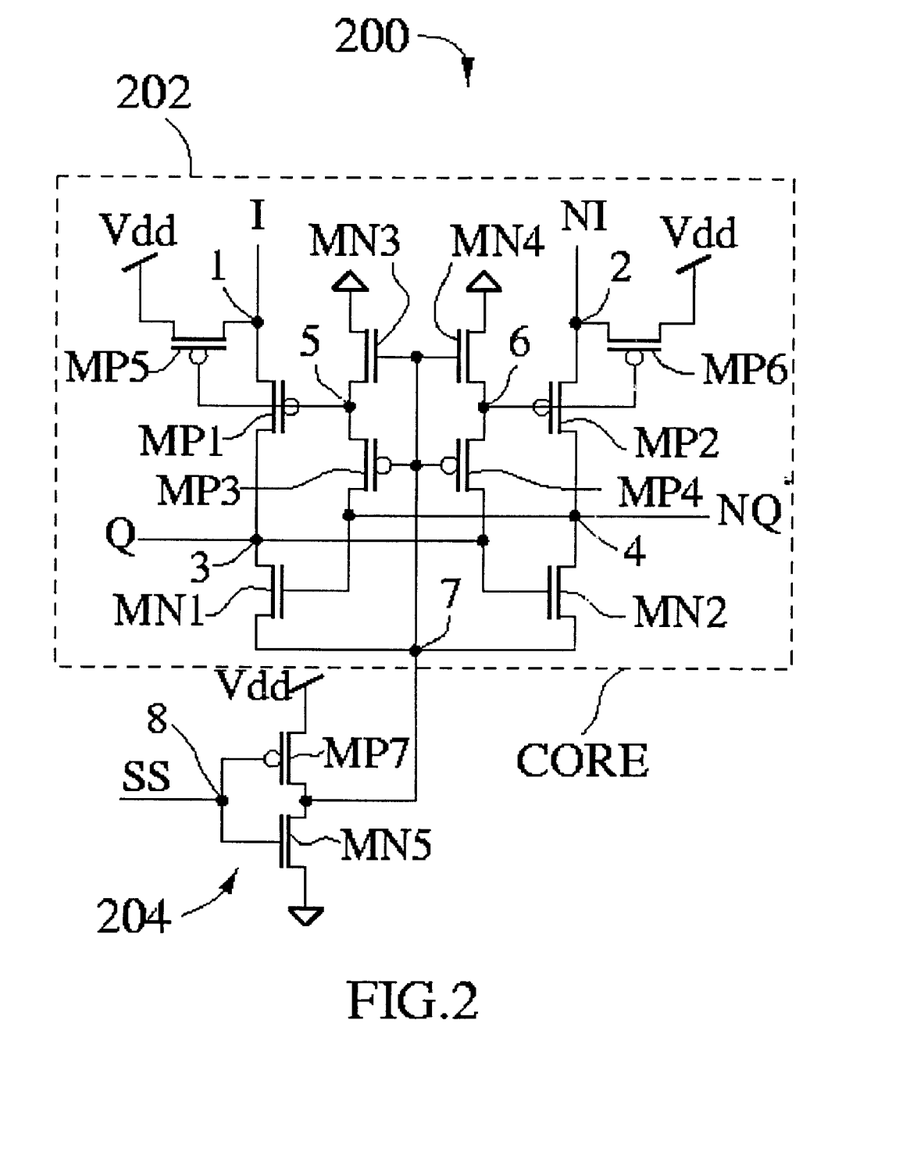
FIG. 2 shows a circuit diagram of a sense amplifier constructed according to the present invention.

FIG. 2 shows a CMOS sense amplifier 200 constructed in accordance with the present invention. The sense amplifier 200 includes PMOS transistors MP1, MP2, MP3, MP4, MP5, MP6, MP7, and NMOS transistors MN1, MN2, MN3, MN4, and MN5. The sense amplifier 200 includes a core circuit 202 and a control inverter 204. The core 202 is formed by the transistors MP1–MP6, MN1–MN4, and the control inverter 204 is formed by the transistors MP7 and MN5. The core 202 of the sense amplifier may be used in cascade connections for performing logic functions according to other embodiments of the present invention.

The source of MP1 is coupled to the input node 1, its gate is coupled to node 5, and its drain is coupled to output node 3. The source of MP2 is coupled to input node 2, its gate is coupled to node 6, and its drain is coupled to output node 4. Sources of MN1 and MN2 are coupled to the node 7, their drains and gates are cross-coupled to output nodes 3 and 4 respectively. Gates of MN3, MN4 are coupled to the node 7, their source-drain current paths are coupled between nodes 5 and ground and node 6 and ground, respectively. Gates of MP3, MP4 are coupled to the node 7, their source-drain current paths are coupled between nodes 5, 4 and nodes 6, 3 respectively. Gates of MP5, MP6 are coupled to nodes 5 and 6 respectively, and their source-drain paths are coupled between input node 1 and Vdd and input node 2 and Vdd, respectively. Control inverter MP7, MN5 has its input coupled to the input node 8 and its output coupled to the node 7. The sense amplifier 200 operates in four states: the quiescent state, the sensing state, the latching state and the recovery state.

In the quiescent state, input SS (at node 8) is low, inputs I and NI (at nodes 1, 2) are precharged to Vdd. Further, node 7 is high, consequently, nodes 5 and 6 are low and MP1 and MP2 are open. Nodes 3 and 4 are high, so DC power consumption depends only on the leakage currents of the transistors MN5, MP3, MP4. Opened weak transistors MP5, MP6 protect the inputs from drifting after the precharge process is complete.

Figure 3:
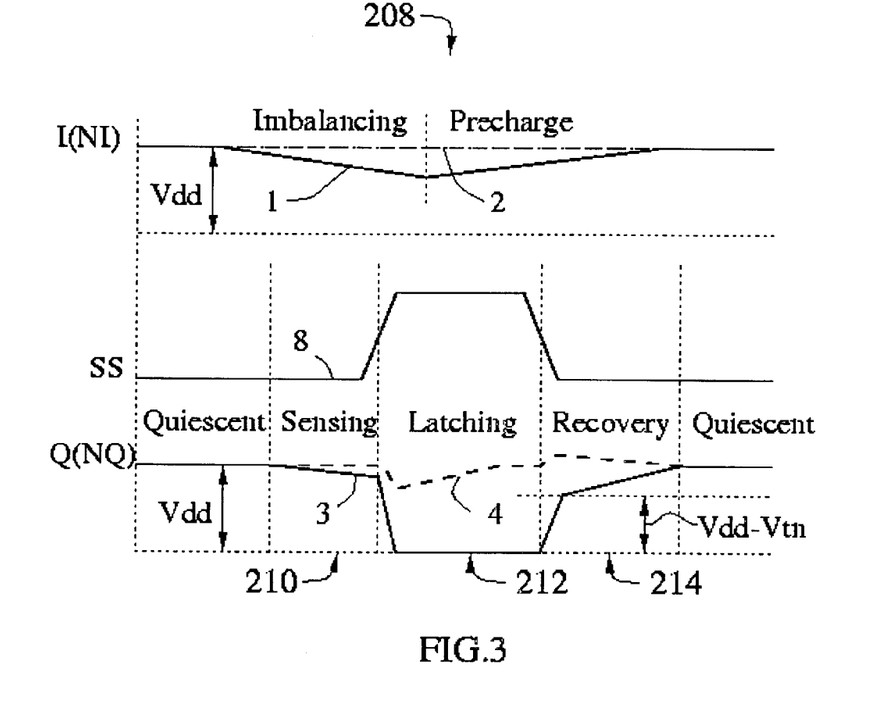
FIG. 3 shows a timing diagram of the sense amplifier of FIG. 2.

FIG. 3 shows a timing diagram 208 illustrating operation of the circuit 200. The timing diagram 208 shows how the sensing state 210 begins when a low voltage swing appears between complementary inputs 1 and 2. Through the open transistors MP1 and MP2, this low voltage swing is delivered to cross-coupled nodes 3 and 4.

The latching state 212 is triggered by the arrival of a pulse SS at the node 8. When the pulse SS arrives at the node 8, MN5 is turned on, MP7 is turned off and the node 7 is pulled down to ground. At the moment when voltage at node 7 reaches Vdd-Vtn (where Vtn is the threshold voltage of NMOS transistor) transistors MN1, MN2 begin to conduct initiating the discharge of cross-coupled nodes 3, 4. Because of the positive feedback, the node with the lower voltage (shown in FIG. 3 as node 3) will be pulled even lower and will retard the discharging process of the cross-coupled node 4. The transistors MP1, MP2 up to this moment are still opened and counteract the discharging process more at node 4 than at node 3, according to the input imbalance.

When the conductivity of MP2 and MN2 become equal, recovery of the node 4 begins. Low voltage at node 7 leads to turning off transistors MN3, MN4 and turning on transistors MP3, MP4. Positive feedback is delivered to the gates of MP1, MP2 through turned on MP3, MP4 and node 5 is pulled up. The transistor MP1 is turned off and cuts off the DC path from input 1 to ground. The transistor MP2 remains open and provides the recovery of node 4 to the input voltage at node 2.

The falling edge of the pulse SS initiates the recovery state 214. The transistor MN5 is turned off, MP7 is turned on and node 7 is pulled up. The transistors MP3, MP4 are turned off, transistors MN3, MN4 are turned on and the node 5 is pulled down to ground. The recovery state divides in two stages. In the first stage, the discharged node 3 is pulled to Vdd-Vtn through the open transistor MN1 following the rising slope at node 7. In the second stage, the transistors MP1, MP2 are turned on and nodes 3, 4 are pulled to input voltages I and NI. The precharge process of the input lines results in pulling nodes 1, 2 and, subsequently, nodes 3 and 4 to Vdd.

Figure 4:
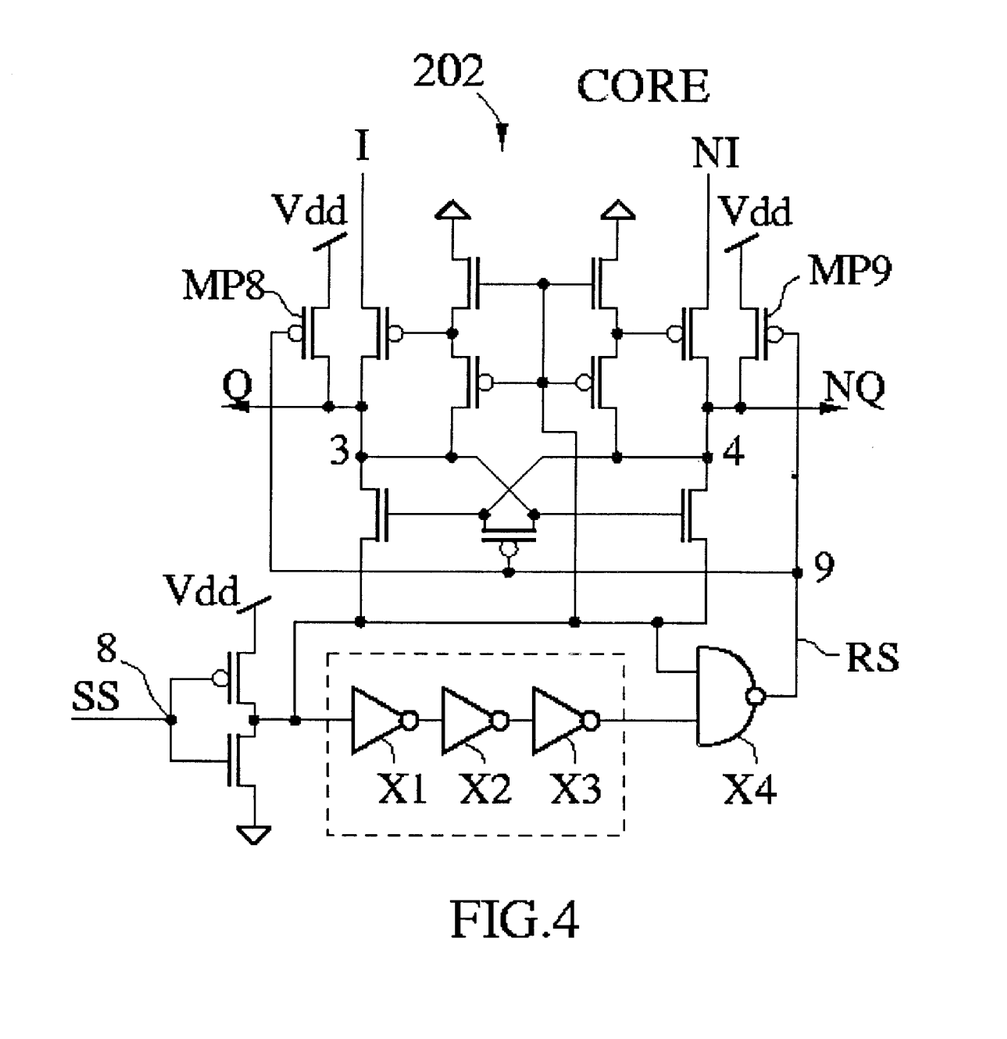
FIG. 4 shows a circuit diagram of a sense amplifier with self-recovery circuit according to the present invention.

FIG. 4 shows the CMOS sense amplifier 200 including the core 202 with a self-recovery circuit constructed in accordance with the present invention. The self-recovery circuit is intended to shorten the recovery time and to provide reliable operation of the sense amplifier at high clock frequencies. The self-recovery circuit includes a delay circuit 21, NAND gate X4 and PMOS transistors MP8, MP9, and MP10. The delay circuit 21 may include one or more conventional inverters, such as X1, X2 and X3, or any other type of delay circuit. The input of the delay circuit 21 is coupled to the node 7, and the output of the delay circuit 21 is coupled to one of the inputs of the NAND gate X4. Another input of X4 is coupled to the node 7 and the output of X4 is coupled to the node 9. The gates of MP8, MP9, and MP10 are coupled to the node 9, drain-source paths of MP8 and MP9 are coupled between nodes 3 and Vdd and nodes 4 and Vdd, respectively. Drain-source path of MP10 is coupled between nodes 3 and 4.

Figure 5:
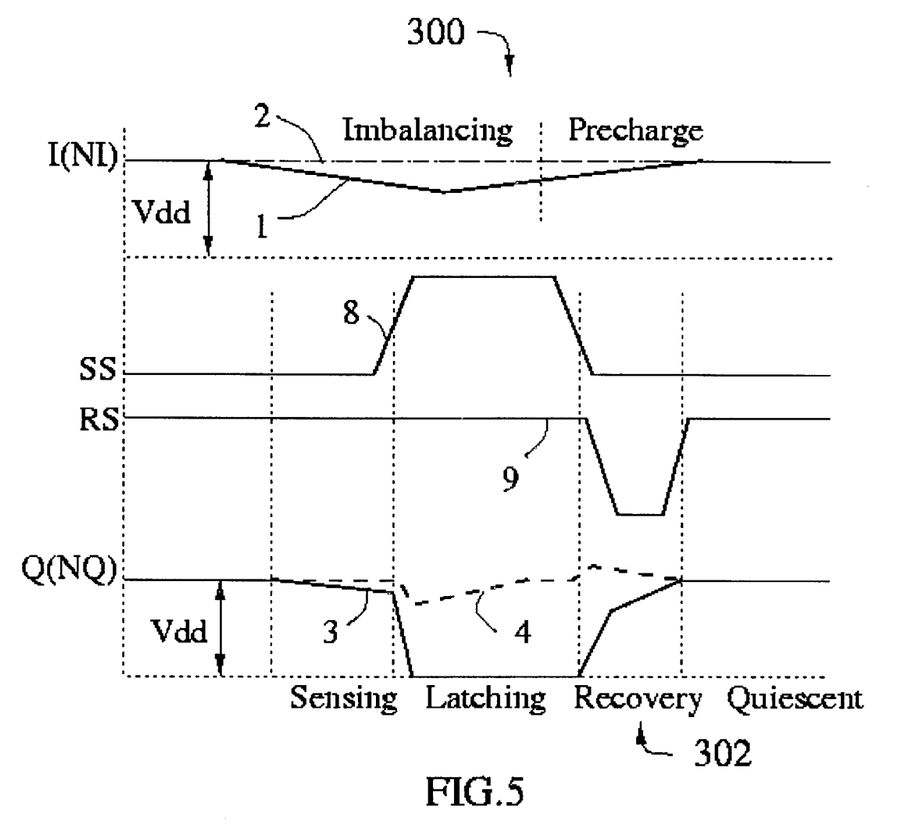
FIG. 5 shows a timing diagram of the sense amplifier of FIG. 4.

FIG. 5 shows a timing diagram 300 illustrating the operation of the circuit of FIG. 4. The difference in operation between the sense amplifier shown in FIG. 4 and the sense amplifier 200 relates to the recovery state 302. The recovery state 302 is initiated by the falling edge of the pulse SS. Referring to FIG. 4, the transistor MN5 is turned off, MP7 is turned on and node 7 is pulled up. The output of the delay circuit 21 remains high for a time determined by its delay. The NAND gate X4 is turned on, node 9 goes low and transistors MP8, MP9, MP10 are turned on. This results in pulling up and equalizing the nodes 3 and 4. When the slope of the pulse at the node 7 reaches the output of the delay circuit, the corresponding input of X4 goes low and NAND gate X4 is turned off. The node 9 is pulled up to Vdd, the transistors MP8, MP9, MP10 are turned off and the recovery state 302 is finished.

Figure 6:
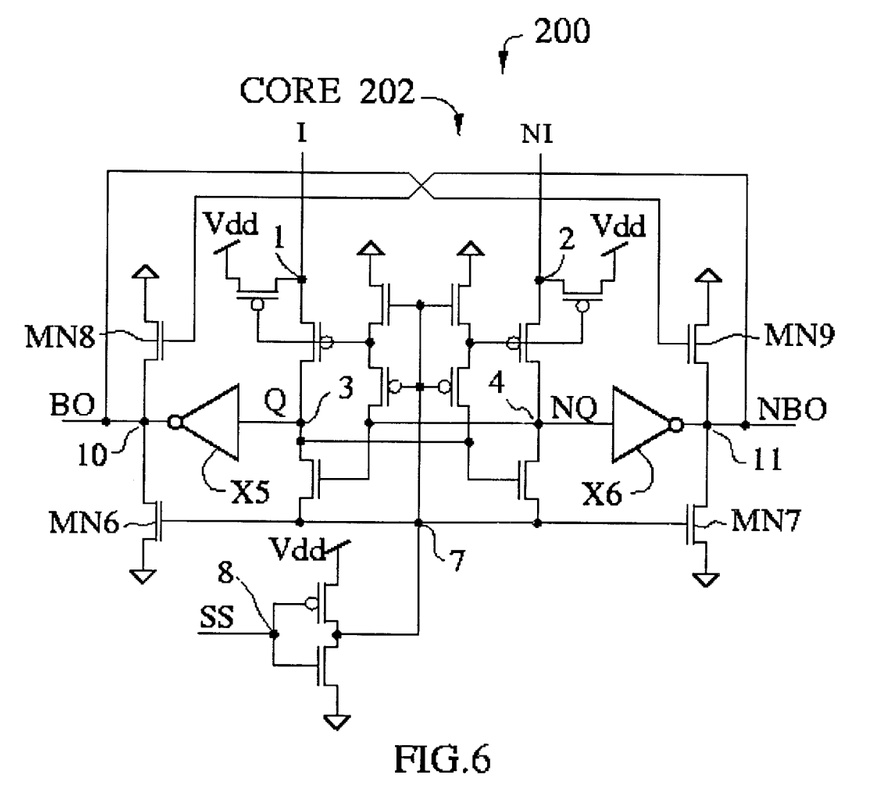
FIG. 6 shows a circuit diagram of a sense amplifier with an output buffer circuit according to the present invention.

FIG. 6 shows the CMOS sense amplifier 200, including the core 202, coupled with a high-output buffer in accordance with the present invention. The high-output buffer includes inverters X5, X6, NMOS transistors MN6, MN7, MN8, MN9. The high-output buffer provides reliable operation of the sense amplifier 200 under high capacitive, low impedance or nonsymmetrical loading. The inputs of inverters X5, X6 are coupled to nodes 3, 4 while the outputs of inverters X5, X6 are coupled to nodes 10, 11 respectively. The gates of MN6 and MN7 are coupled to node 7, and their drainsource paths are coupled between nodes 10 and ground, and node 11 and ground, respectively. The gate of MN8 is coupled to the node 11, its drain-source path is coupled between node 10 and ground. The gate of MN9 is coupled to the node 10, its drainsource path is coupled between node 11 and ground. Thus, the transistors MN8 and MN9 present a cross-coupled NMOS pair.

The channel widths of PMOS transistors in inverters X5 and X6 are comparable to that of MN1 and MN2, but NMOS transistors in inverters X5 and X6 may be an order of magnitude smaller to provide maximum speed and fan-out. In the quiescent state, nodes 3, 4, 7 are high, MN6, MN7 are turned on, the PMOS transistors X5, X6 are turned off, and so output nodes 10, 11 are low and MN8, MN9 are turned off. In the latching state, node 7 and one of the cross-coupled nodes 3, 4 go low.

Figure 7:
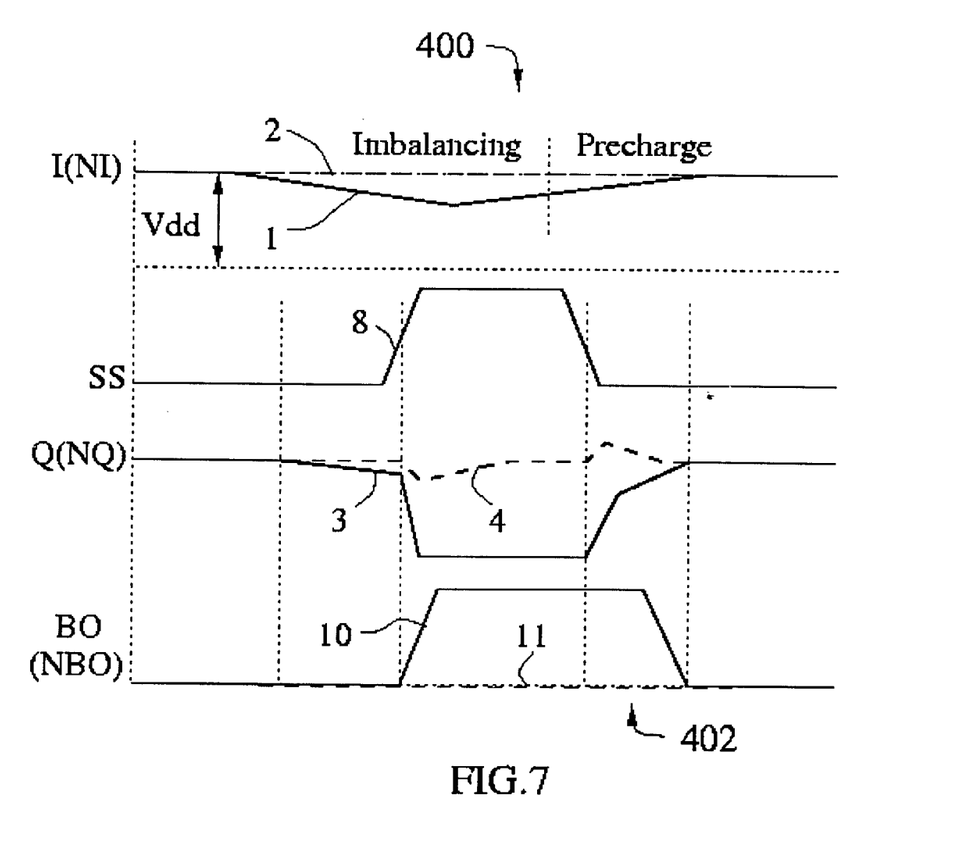
FIG. 7 shows a timing diagram of the sense amplifier of FIG. 6.

FIG. 7 shows a timing diagram 400 illustrating operation of the circuit of FIG. 6. As the node 3 goes low a negative response appears at the node 4. The magnitude of the response depends on the input voltage swing between nodes 1, 2. The transistors MN6, MN7 are turned off, PMOS transistor in inverter X5 is turned on, and node 10 goes high. The transistor MN9 is turned on and rejects the positive noise pulse caused by the response at node 4 via PMOS transistor of X6.

In a recovery state 402, the node 8 goes low, and consequently node 7 goes high, subsequently node 3 goes high and PMOS transistor in inverter X5 is turned off. Simultaneously transistors MN6, MN7 are turned on providing fast discharge of output node 10 to ground. The transistors MN6, MN7 are turned on through all the states except the latching state, providing high noise immunity of the sense amplifier.

Figure 8:
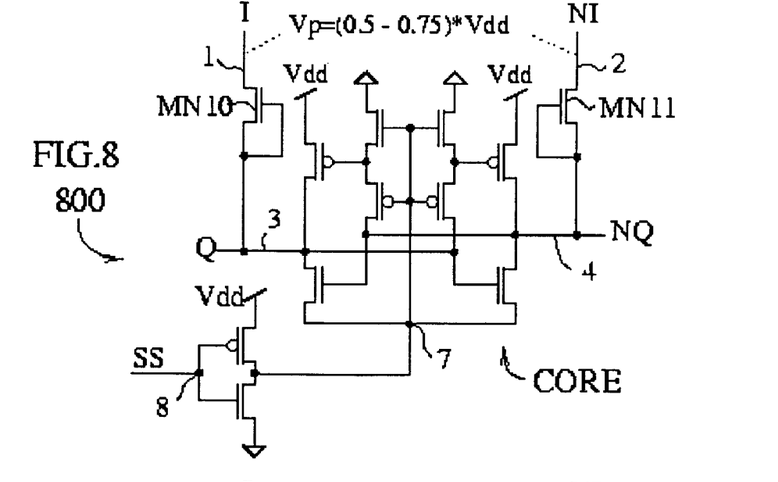
FIG. 8 shows a circuit diagram of a sense amplifier with level conversion circuit for providing a first pre-charge voltage according to the present invention.
Figure 9:
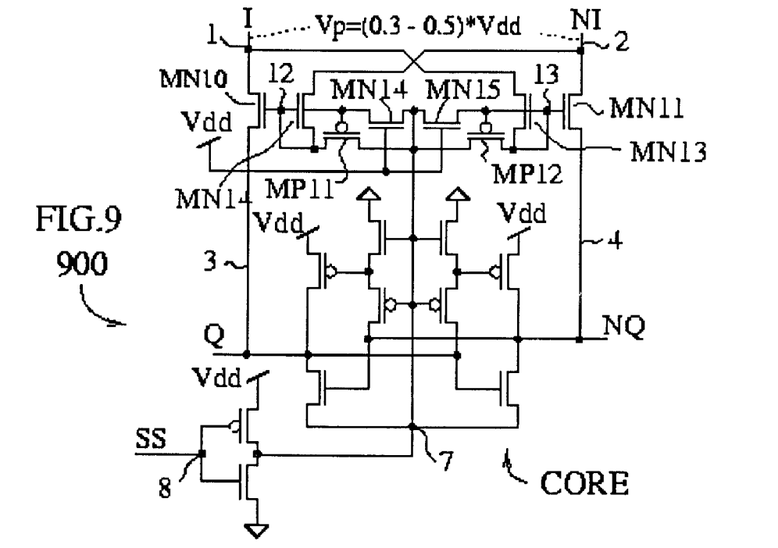
FIG. 9 shows a circuit diagram of a sense amplifier with level conversion circuit for providing a second pre-charge voltage according to the present invention.

FIGS. 8 and 9 show the CMOS sense amplifier 200 with two different level conversion circuits according to two embodiments of the present invention. The level conversion circuits provides correct operation of the sense amplifier 200 at an input precharge voltage range of Vp=(0.3 to 0.7)*Vdd.

The first level conversion circuit 800 shown in FIG. 8 is intended for use at a precharge voltage range of Vp=(0.5 to 0.7)*Vdd. The level conversion circuit 800 includes NMOS transistors MN10, MN11. The gate of MN10 is coupled to the source of MN10 and is further coupled to node 3. The drain of MN10 is coupled to the input I (node 1). The gate of MN11 is coupled to the source of MN11 and is further coupled to node 4. The drain of MN11 is coupled to the input NI (node 2).

The second level conversion circuit 900 shown in FIG. 9 is intended for use at a precharge voltage range of Vp=(0.3 to 0.5)*Vdd. The level conversion circuit 900 includes PMOS transistors MP11, MP12, and NMOS transistors MN10, MN11, MN12, MN13, MN14, and MN15. The gate of MN10 is coupled to node 12, its drain-source path is coupled between input node 1 and node 3 of the sense amplifier 200. The gate of MN11 is coupled to the node 13, its drain-source path is coupled between input node 2 and node 4 of the sense amplifier 200. The gate and the drain of MN12 are coupled to the node 12 and its source is coupled to input node 2. The gate and the drain of MN13 are coupled to the node 13 and its source is coupled to input node 1. The gate and the drain of MP11 are coupled to the node 12, its source is coupled to the node 7 of the sense amplifier 200. The gate and the drain of MP12 are coupled to the node 13, its source is coupled to the node 7 of the sense amplifier 200. The gates of MN14, MN15 are coupled to Vdd, their sources are coupled to the node 7 of the sense amplifier, and their drains are coupled to nodes 12 and 13 respectively.

Figure 10:
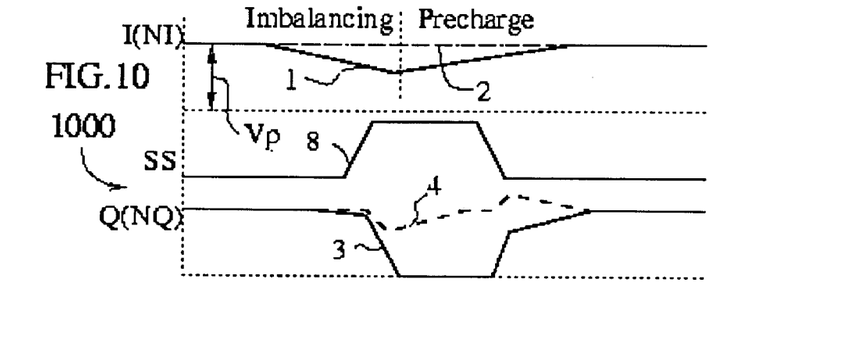
FIG. 10 shows a timing diagram of the sense amplifier with the level conversion circuit of FIG. 9.

FIG. 10 shows a timing diagram 1000 illustrating the operation of the circuit 900 of FIG. 9. In the sensing state, the transistors MP11, MN12 create a reference gate voltage for transistor MN10 (node 12). This reference gate voltage is associated with the voltage swing at the input node 2 and provides voltage gain at node 3 with respect to voltage swing between input nodes 1 and 2. Correspondingly, the transistors MP12, MN13 create reference gate voltage for transistor MN11 (node 13) associated with the voltage swing at the input node 1 and provides voltage gain at node 4 with respect to the voltage swing between input nodes 1 and 2. In the latching state, node 7 goes low and through constantly open pass-transistors MN14, MN15, pulls down nodes 12 and 13. Transistors MN10, MN11 are turned off and disconnect input lines 1, 2 from output nodes of the sense amplifier (nodes 3, 4).

The three circuits discussed above may be applied to the sense amplifier 200 in arbitrary combinations as necessary. Exemplary embodiments of such combinations are discussed below.

Figure 11:
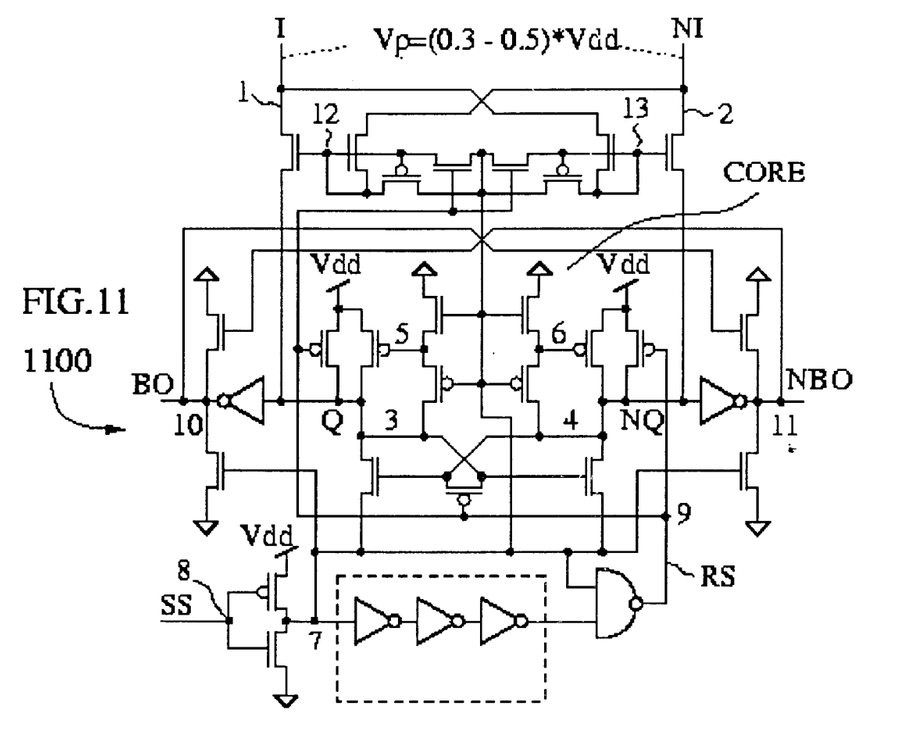
FIG. 11 shows a circuit diagram of a sense amplifier with a combination of self-recovery circuit, output buffer circuit and level conversion circuit according to the present invention.
Figure 12:
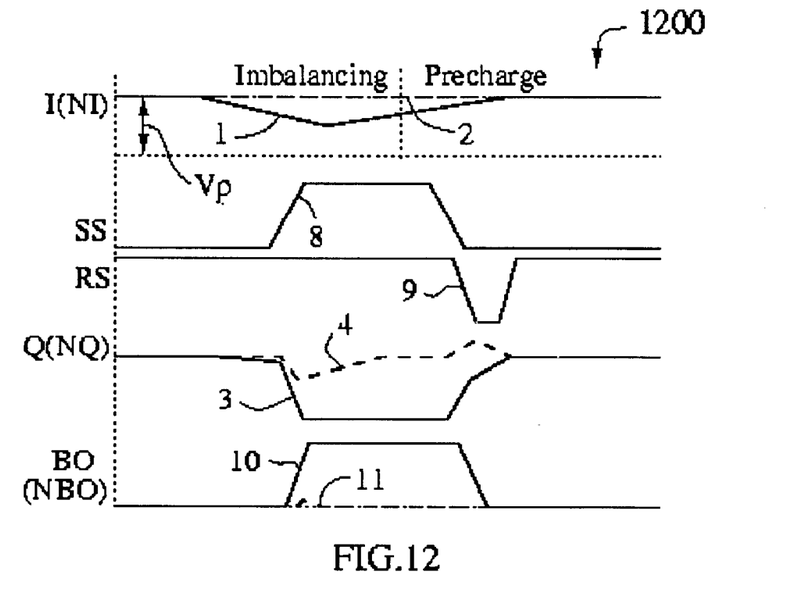
FIG. 12 shows a timing diagram of the sense amplifier of FIG. 11.

FIG. 11 shows an exemplary circuit 1100 which includes a combination of the self-recovery, output buffer and level conversion circuits in accordance with the present invention presented above. FIG. 12 shows a timing diagram 1200 illustrating operation of the circuit of FIG. 11.

The core of the sense amplifier 200 may be used as a building block in numerous high speed, low voltage circuit applications. One such application is described below.

Figure 13:
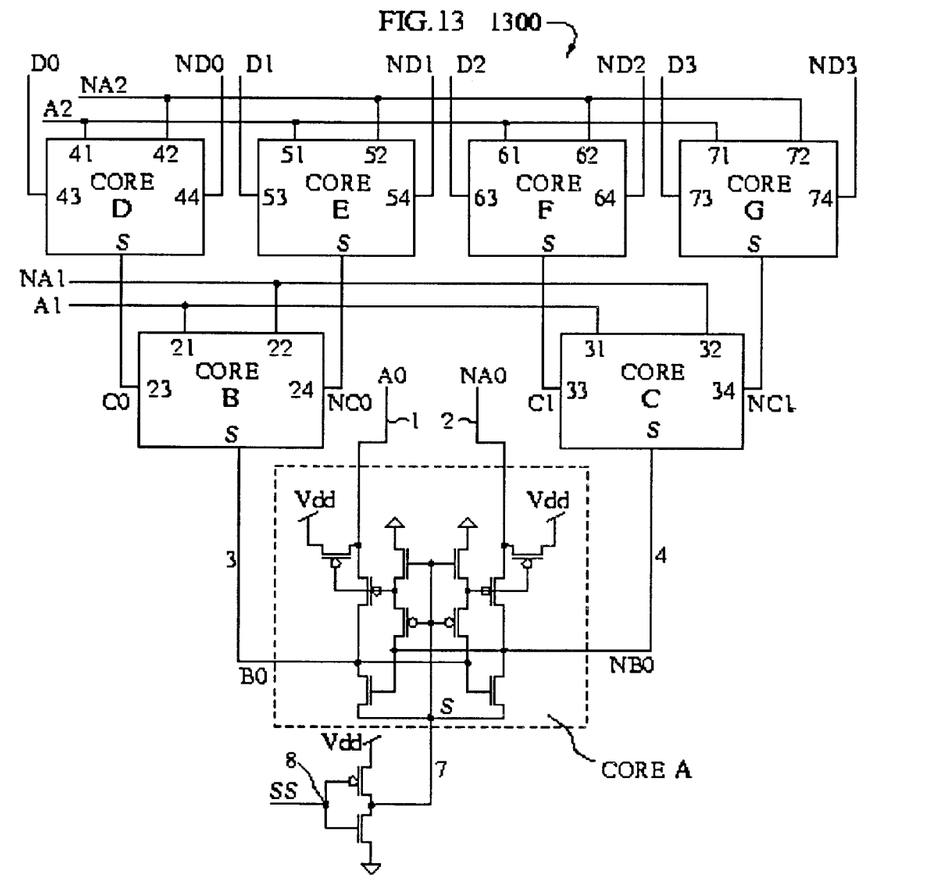
FIG. 13 shows a block diagram a 3 to 8 decoder constructed from the sense amplifier of FIG. 2 according to the present invention.
Figure 14:
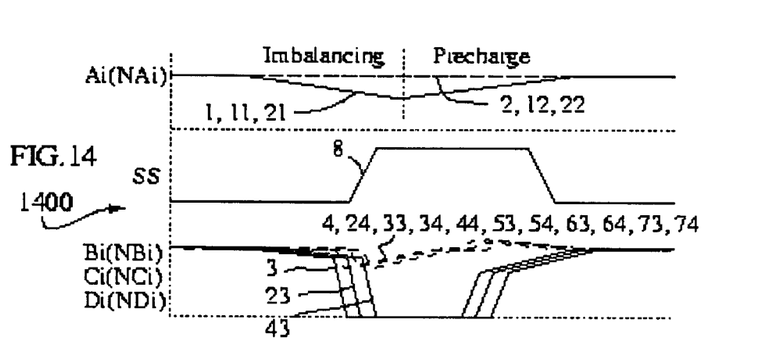
FIG. 14 shows a timing diagram of the 3 to 8 decoder of FIG. 13.

FIG. 13 shows a 3 to 8 decoder 1300 based on the cascade connection of sense amplifiers cores according to the present invention. The decoder includes sense amplifier A and sense amplifier cores B, C, D, E, F, G composed in three stages: a first stage that includes the sense amplifier A, a second stage that includes sense amplifiers that have cores B and C, and a third stage that includes sense amplifiers that have cores D, E, F and G. Node 7 of the first sense amplifier A is marked S and the corresponding nodes of the following cores B–G, are marked S too. Output nodes 3, 4 of A are coupled to nodes S of cores B, C respectively, output nodes 23, 24 of B are coupled to nodes S of cores D, E respectively, output nodes 33, 34 of C are coupled to nodes S of cores F, G respectively. Input lines A0, NA0 are coupled to nodes 1, 2 of A respectively, input lines A1, NA1 are coupled to nodes 21, 22 of B and nodes 31, 32 of C respectively, input lines A2, NA2 are coupled to nodes 41, 42 of D, nodes 51, 52 of E, nodes 61, 62 of F, and nodes 71, 72 of G respectively. The decoder FIG. 13 operates in four states similarly to the sense amplifier 200. FIG. 14 shows a correspondent timing diagram for the 3 to 8 decoder 1300.

The accessory circuits considered above may be applied to the cascade composition of sense amplifiers as necessary. In particular, it is possible to apply selfrecovery and level conversion circuitry to any stage of the decoder of FIG. 13. It is also possible to apply output buffer circuitry to the third stage.

It is intended that the decoder specification be only exemplary, and that the core of the sense amplifier 200 may be used in combination with NMOS and PMOS transistors in many of today's high speed, low power applications such as for circuit design in microprocessors, semiconductor memory devices, or any chip requiring high speed, low power logic.

The present invention provides a clocked CMOS sense amplifier for high speed latching of low voltage complementary signals. It will be apparent to those with skill in the art that modifications to the above embodiments can occur without deviating from the scope of the present invention. Accordingly, the disclosures and descriptions herein are intended to be illustrative, but not limiting, of the scope of the invention which is set forth in the following claims.

What is claimed is:

1. A multistage sense amplifier comprising:
   a first stage sense amplifier core comprising:
   a first PMOS pair (MP1, MP2) that outputs complementary low voltage input signals;
   a cross-coupled NMOS pair (MN1, MN2) with a common source node (7) for latching the complementary low voltage input signals;
   a control circuit coupled to the first PMOS pair; and
   a second PMOS pair (MP5, MP6) coupled to the first PMOS pair for preventing the complementary low voltage input signals from drifting;
   a control inverter for receiving a strobe pulse and for providing a strobe signal. to the cross-coupled NMOS pair, wherein the complementary low voltage input signals are latched;
   a second stage including at least two of the first stage sense amplifier cores, wherein common nodes of cross-coupled NMOS transistors of the second stage are coupled to the cross-coupled nodes of the first stage sense amplifier core; and
   a third stage including a plurality of the first stage sense amplifier cores, wherein common nodes of cross-coupled NMOS transistors of the third stage are coupled to cross-coupled nodes of the second stage.

2. A sense amplifier comprising:
   a first PMOS pair (MP1, MP2) that outputs complementary low voltage input signals;
   a cross-coupled NMOS pair (MN1, MN2) with a common source node (7) for latching the complementary low voltage input signals;
   a control circuit coupled to the first PMOS pair and the common source node;
   a second PMOS pair (MP5, MP6) coupled to the first PMOS pair for preventing the complementary low voltage input signals from drifting;
   a control inverter for receiving a strobe pulse and for providing a strobe signal to the cross-coupled NMOS pair, wherein the complementary low voltage input signals are latched;
   a delay circuit for generating a delay signal derived from the strobe signal;
   a NAND gate coupled to the delay circuit coupled to said first PMOS pair, in response to said reset signal for generating a reset signal; and
   a PMOS recovery circuit for adjusting a recovery time of the sense amplifier.

3. The sense amplifier of claim 2, further comprising:
   first and second output inverters (X5, X6), wherein each output invertor includes a plurality of strong PMOS and weak NMOS transistors, and each output invertor has an inverter input coupled to the cross-coupled NMOS pair and includes an invertor output;
   a reset circuit, comprising first and second NMOS transistors (MN6, MN7) coupled to the outputs of the first and second output inverters, respectively; and
   a noise-rejection circuit, comprising two cross-coupled NMOS transistors (MN8, MN9) coupled to the outputs of the first and second output inverters.

4. The sense amplifier of claim 2, wherein the input nodes of the first PMOS pair are coupled to a supply voltage, and the sense amplifier further comprises two NMOS transistors (MN10, MN11) for receiving the complementary low voltage input signals and delivering them to the cross-coupled NMOS pair (MN1, MN2).

5. The sense amplifier of claim 2, wherein the input nodes of first PMOS pair are coupled to a supply voltage, and the sense amplifier further comprises:
   a reference voltage generator controlled by the control inverter;
   two NMOS transistors (MN10, MN11) controlled by the reference voltage generator for receiving the complementary low voltage input signals and delivering them to the cross-coupled NMOS transistors (MN1, MN2).

6. A sense amplifier comprising:
   a first PMOS pair (MP1, MP2) that outputs complementary low voltage input signals;
   a cross-coupled NMOS pair (MN1, MN2) with a common source node (7) for latching the complementary low voltage input signals;
   a control circuit coupled to the first PMOS pair and the common source node;
   a delay circuit for generating a delay signal derived from a strobe signal;
   a NAND gate coupled to the delay circuit for generating a reset signal; and
   a PMOS recovery circuit coupled to said first PMOS pair, in response to said reset signal for adjusting a recovery time of the sense amplifier.

7. A sense amplifier comprising:
   a first PMOS pair (MP1, MP2) that outputs complementary low voltage input signals;
   a cross-coupled NMOS pair (MN1, MN2) with a common source node (7) for latching the complementary low voltage input signals; and
   a control circuit coupled to the first PMOS pair and the common source node;
   first and second output inverters (X5, X6), wherein each output invertor includes a plurality of strong PMOS and weak NMOS transistors, and each output invertor has an inverter input coupled to the cross-coupled NMOS pair and includes an invertor output;
   a reset circuit, comprising first and second NMOS transistors (MN6, MN7) coupled to the outputs of the first and second output inverters, respectively; and
   a noise-rejection circuit, comprising two cross-coupled NMOS transistors (MN8, MN9) coupled to the outputs of the first and second output inverters.

8. A sense amplifier operable from a supply voltage, comprising:
   a first PMOS pair (MP1, MP2) coupled to the supply voltage to output complementary low voltage input signals;
   a cross-coupled NMOS pair (MN1, MN2) with a common source node (7) for latching the complementary low voltage input signals; and
   a control circuit coupled to the first PMOS pair and the common source node;
   wherein the input nodes of the first PMOS pair are coupled to a supply voltage, and the sense amplifier further comprises two NMOS transistors (MN10, MN11) for receiving the complementary low voltage input signals and delivering them to the cross-coupled NMOS pair (MN1, MN2).

9. A sense amplifier operable from a supply voltage, comprising:

a first PMOS pair (MP1, MP2) coupled to the supply voltage to output complementary low voltage input signals;

a cross-coupled NMOS pair (MN1, MN2) with a common source node (7) for latching the complementary low voltage input signals;

a control circuit coupled to the first PMOS pair and the common source node a reference voltage generator controlled by the control circuit; and two NMOS transistors (MN10, MN11) controlled by the reference voltage generator for receiving the complementary low voltage input signals and delivering them to the cross-coupled NMOS transistors (MN1, MN2).

* * * * *